US006844778B2

(12) United States Patent
Oppelt

(10) Patent No.: US 6,844,778 B2
(45) Date of Patent: Jan. 18, 2005

(54) AMPLIFIER DEVICE WITH A SELECTABLE ACTIVE OR PASSIVE OPERATIONAL MODE AND ULTRASONIC APPARATUS

(75) Inventor: Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/358,003

(22) Filed: Feb. 4, 2003

(65) Prior Publication Data

US 2003/0160652 A1 Aug. 28, 2003

(30) Foreign Application Priority Data

Feb. 27, 2002 (DE) .......................................... 102 08 483

(51) Int. Cl.[7] .............................................. H03F 1/14
(52) U.S. Cl. ........................................ 330/51; 330/151
(58) Field of Search ............................ 330/51, 124 R, 330/127, 151, 295, 297

(56) References Cited

U.S. PATENT DOCUMENTS

| 4,285,010 A | | 8/1981 | Wilcox ........................ 348/163 |
| 5,530,923 A | * | 6/1996 | Heinonen et al. ........... 330/295 |
| 6,127,886 A | * | 10/2000 | Khabbaz et al. .............. 330/51 |
| 6,201,441 B1 | * | 3/2001 | Suematsu et al. ............. 330/51 |
| 6,445,729 B1 | * | 9/2002 | Kang ........................... 330/51 |
| 6,591,087 B1 | * | 7/2003 | Oda ............................ 455/78 |
| 6,621,341 B1 | * | 9/2003 | Shifrin ....................... 330/174 |
| 6,680,647 B2 | * | 1/2004 | Brown et al. ................. 330/51 |

FOREIGN PATENT DOCUMENTS

| DE | 197 54 785 A1 | 6/1999 |
| DE | 199 16 902 A1 | 10/2000 |

OTHER PUBLICATIONS

Piezoxide–Wandler v. J. Koch, 1973, Valvo Gmbh Hamburg, S. 157 und 158 Nr. 1.

* cited by examiner

Primary Examiner—Khanh Van Nguyen
(74) Attorney, Agent, or Firm—Brinks Hofer Gilson & Lione

(57) ABSTRACT

An amplifier arrangement comprises an active amplification element arranged between a first and a second contact within a first signal path. A signal fed in at the first contact is amplified in the amplification element. Furthermore, a controller for a variably operation of the amplification element, as well as a passive second signal path. The second signal path, which is arranged parallel with the first signal path and bypasses the first signal path, is also contained therein. An ultrasound device contains such an amplifier arrangement.

17 Claims, 3 Drawing Sheets

AMPLIFIER DEVICE WITH A SELECTABLE ACTIVE OR PASSIVE OPERATIONAL MODE AND ULTRASONIC APPARATUS

REFERENCE TO RELATED APPLICATIONS

The present patent document claims priority to German Application Serial No. DE 10208483.1, filed Feb. 27, 2002, which is hereby incorporated by reference.

FIELD OF THE INVENTION

The invention relates to an amplifier arrangement for amplifying a signal, comprising at least one active amplification element arranged between a first and a second contact within a first signal path, which amplifies a signal fed in at the first contact, and a controller for the variable operation of the amplification element. The invention further relates to an ultrasound device in which the amplifier arrangement is employed.

BACKGROUND

An amplifier arrangement is used in many technical devices. An example of this is a pulse-echo device in the form of a radar device, a sonar device or also of an ultrasound device. By means of such a pulse-echo device, a transmitted signal of a very high signal amplitude is radiated via an appropriately embodied transducer into a medium to be examined, in the case of the radar device into the airspace to be monitored, in the case of a sonar device into an area of water to be monitored, and in the case of the ultrasound device into a human body, for example. A received signal being generated by reflection in the medium to be examined is detected and evaluated after having been appropriately amplified. Such a received signal is constituted for example by the signal fed into the amplification device.

In connection with an ultrasound device, a received signal, which is the result of a reflection near the surface of the human body to be examined, has a relatively high signal amplitude. But because of a strong damping by the tissues, a received signal generated by a reflection in a lower tissue layer has a very low signal amplitude. In order to be able to represent an area located deep in the tissue in a satisfactory manner, a good noise behavior is required of an amplifier arrangement. This means that the amplifier arrangement should be constructed to have a low noise output and should be adapted to noise.

Such an amplifier arrangement is known from and described in DE 199 16 902 A1. By setting of the operating point of the semiconductor amplifier employed, which is matched to the expected signal amplitude of the received signal, a mode of operation is made possible which selectively allows an operation optimized as to distortion or optimized as to noise. If a received signal with a high signal amplitude is expected, i.e., a signal reflected at an area close to the surface of the medium to be examined, the disclosed amplifier arrangement operates in a distortion-optimized mode. If, however, a received signal with a low signal amplitude, i.e. a signal reflected at an area located deeper in the medium to be examined, is expected, the disclosed amplifier arrangement operates in a noise-optimized mode. The transition between the two modes of operation takes place by changing the D.C. voltage signals supplied to the semiconductor amplifier for setting the operating point.

A piezo-electric sound transducer is usually employed as the sound transmitter and sound receiver in such an ultrasound device. The electrical equivalent diagram of such a piezo-electric sound transducer which is applicable in case of reception is substantially distinguished by a capacitive resistor located parallel in relation to the sound transducer outlet. For compensating the effects of this parallel capacitive resistor on the frequency response, an amplifier arrangement is presently used, which is described in the technical publication "Piezoxide-Wandler" [piezo-oxide transducers] of J. Koch, 1973, Valvo GmbH Hamburg, on pages 157 and 158, or also in U.S. Pat. No. 4,285,010. In this amplifier arrangement the effects of the parallel capacitive resistor of the sound transducer are at least partially compensated by an inductive resistor switched in series or parallel with the sound transducer output.

Moreover, an amplifier arrangement in the form of an intermediate amplifier for bidirectional signal transmission, having several signal paths, is known from DE 197 54 785 A1. However, the intermediate amplifier does not have a controller for the variable conduct of operations of the amplification elements provided in the intermediate amplifier. The intermediate amplifier is also not intended for pulse-echo operations or for use in an ultrasound device.

Together with the sound transducer, the known amplifier arrangements are sometimes integrated into a single component. This is then identified as an active sound transducer, or active transducer head, since the component contains, besides the actual sound transducer with the amplifier arrangement, also an active component, i.e., one that requires an energy supply. The sound transducer itself is purely passive. It does not require a separate energy supply. Although the integrated amplifier arrangement offers the advantage of signal processing as close as possible to the source, in view of a satisfactory integrating ability, it actually represents an undesired heat source.

OBJECT AND SUMMARY

It is now the object of the invention to provide an amplifier arrangement of the type identified at the outset, which diplays a reduced heat generation and therefore an improved integration capability. This object is attained by an amplifier arrangement for amplifying a signal. The amplifier arrangement is distinguished by a second signal path, which is arranged parallel with the first signal path and bypasses the first signal path.

It is possible to considerably reduce the power consumption, and therefore also the heat generation, of the amplifier arrangement, if the amplification element in the first signal path is only activated when the signal present at the first contact has a low signal amplitude and requires amplification. But in all other cases the amplification element can be deactivated, i.e. switched off. In that case no static currents flow in the amplification element and the power consumption goes down to zero. With an amplification element deactivated in this way, the signal at the first contact is still dependably transmitted to the second contact and is not blocked by the deactivated amplification element. A second signal path is provided which is switched parallel with the first signal path. In contrast to the first signal path, the second signal path does not contain any active circuit elements. It is passive and therefore does not result in any heating of the amplifier arrangement based on the energy supply.

Depending on the waiting signal, the amplifier arrangement is operated either actively or passively. In the process, it is possible to make use of the often provided knowledge regarding the basic course of the maximum amplitude of the waiting signal. In this way, the operating mode of the amplifier arrangement can be adapted to the expected maximal signal amplitude by the controller. Based on the knowledge regarding the basic signal course, this adaptation is also possible without a continuous measurement of the signal amplitude during normal amplification operations. Therefore the control of the operating mode is automatically possible, in particular without the aid of an actual measured value, i.e., as a value-free measurement.

The additionally provided second signal path allows a deactivation of the amplification element even if a signal is present at the first contact. Because of the lack of a signal transmission when the amplification element is deactivated, this would not be possible in a conventional amplifier arrangement without a second signal path. The passive operating mode, which is possible over wide phases, leads to a considerably reduced power consumption and heating of the amplifier arrangement. The integration capability is thereby improved.

In particular, switching between the active and passive operating modes can take place continuously, so that a threshold effect, or also a switch-on process, is completely, or at least to a great extent, repressed.

The amplifier arrangement is designed as a transmitter/receiver amplifier arrangement in one embodiment. In particular, the first, as well as the second signal path, are each designed for a first signal direction in this case. With a transmitter/receiver amplifier arrangement, this is the direction of the received signal.

In connection with a further embodiment, the amplifier arrangement contains, besides the first and second signal path, a further, also parallel-switched signal path. This third signal path is intended for the second signal direction in particular, which is oriented opposite the first signal direction. In a transmitter/receiver amplifier arrangement, this second signal direction corresponds to that of the transmitted signal. Depending on the embodiment, the first and third signal paths are either be combined, i.e., have the same components at least in part, or they can be constructed completely separate from each other.

A further variation is practical wherein the third signal path contains a bypass element. This bypass element is advantageously adapted to the expected, greatly different signal amplitudes of the signals in the first and second signal direction. In this way, the bypass element represents an open circuit for signals of low amplitude which are to be transmitted in the first signal direction (e.g., the receiving direction), for example. The bypass element represents a short circuit for all practical purposes for signals of a high amplitude which are expected, for example, in the second signal direction (e.g., sending direction). Such a bypass element is realized in particular in the form of a pair of diodes made of two parallel-connected and oppositely oriented semiconductor diodes.

Another embodiment is advantageous wherein a passive compensation element is provided in the second signal path intended for the first signal direction. In this case, the compensation element is used for an undesired compensating effect of the frequency response of the signal of the signal source at the first contact, which is to be amplified. In case of the employment of the amplifier arrangement in an ultrasound device, the signal source usually is a piezoelectric sound transducer. Its electrical equivalent diagram has as an essential component a parallel capacitive resistor at the output. With known amplifier arrangements, this parallel capacitive resistor is compensated by a parallel connected input inductive resistor connected at the first contact. In connection with the reception, the inductive resistor is not only effective for the low signal amplitudes, but is also effective in connection with the transmission. Since the transmitted signal has a very high signal amplitude, a saturation of the inductive resistor, which distorts the signal shape, may easily occur. To prevent this, such an inductive resistor is usually laid out with a very large structural volume. The integration capability becomes worse because of this. The inductive resistor which, with known amplifier arrangements, was switched parallel at the first contact, can be replaced by a corresponding compensation element in the second signal path. Since the second signal path is preferably intended for the first signal direction (e.g., the receiving direction), when the second compensation element is dimensioned, it is not necessary to take the high signal amplitudes occurring in the second signal direction (e.g., transmitting direction) into consideration. Thus it is possible to use a smaller structural volume without the danger of saturation occurring. This has a positive effect on the integration capability. The compensation element in the second signal path can be an inductive resistor, as well as a more elaborate reactive impedance, for example, a combination of several inductive resistors and capacitive resistors.

In a further embodiment, the controller provided for conducting the operation of the amplification element contains at least a controllable voltage source. For setting the operating point of the semiconductor components which are customarily employed in the realization of the amplifier arrangement, at least one D.C. voltage, or D.C. current signal is used. The operating point, and therefore the mode of operation of the amplification element, can be affected by changing this D.C. signal. It is in particular possible to deactivate the amplifier arrangement by setting the D.C. signal used for setting the operating point to zero. It is therefore possible by a controllable voltage and/or current source to control the operating mode of the amplifier arrangement in a simple manner. Alternatively, to a controllable source, it is also possible to use a constant source together with another controllable element, for example a controllable resistor. Thus, the controller is designed in particular in such a way that the amplification element can be activated and deactivated, i.e. switched on or off.

The amplification element contains a semiconductor circuit designed as an emitter follower in one embodiment. Depending on the requirements made on freedom from distortions and/or the signal quality of the amplified signal, the emitter follower can be designed to be monopolar or bipolar. Customarily, the amplification factor of such an emitter follower is less than or equal to 1. Therefore, the emitter follower is used less for voltage amplification of the signal present at the first contact, but for an impedance adaptation, i.e., the provision of an increased output.

The amplifier arrangement is advantageously employed in connection with a pulse-echo device, in particular in an ultrasound device, or also in a radar or a sonar device. When used in connection with an ultrasound device, the one contact of the amplifier arrangement is electrically connected with a sound transducer. In particular, the sound transducer and the amplifier arrangement can be at least partially integrated, i.e. designed as a common structural unit. In that case, a part of the controller, for example a changeable resistor, can be a component of the structural unit besides the actual amplification element. Furthermore, in this case, the amplifier arrangement is then used as a pre-amplifier of the echo signals received by the sound transducer. Objects to be examined by means of an ultrasound device can be the human body, but also a workpiece made of a solid, in particular, an inorganic material.

Preferred exemplary embodiments, which in no way are limiting, of the amplifier arrangement will now be explained in greater detail by means of the drawings. The present invention is defined by the following claims, and nothing in this section should be taken as a limitation on those claims. Further aspects and advantages of the invention are discussed below in conjunction with the preferred embodiments.

BRIEF DESCRIPTION OF THE DRAWINGS

The drawings are not to scale for reasons of clarity, and certain characteristics are schematically represented.

DETAILED DESCRIPTION OF THE PREFERRED EMBODIMENTS

Corresponding parts have been provided with the same reference symbols in FIG. 1 to 4.

Figure 1:
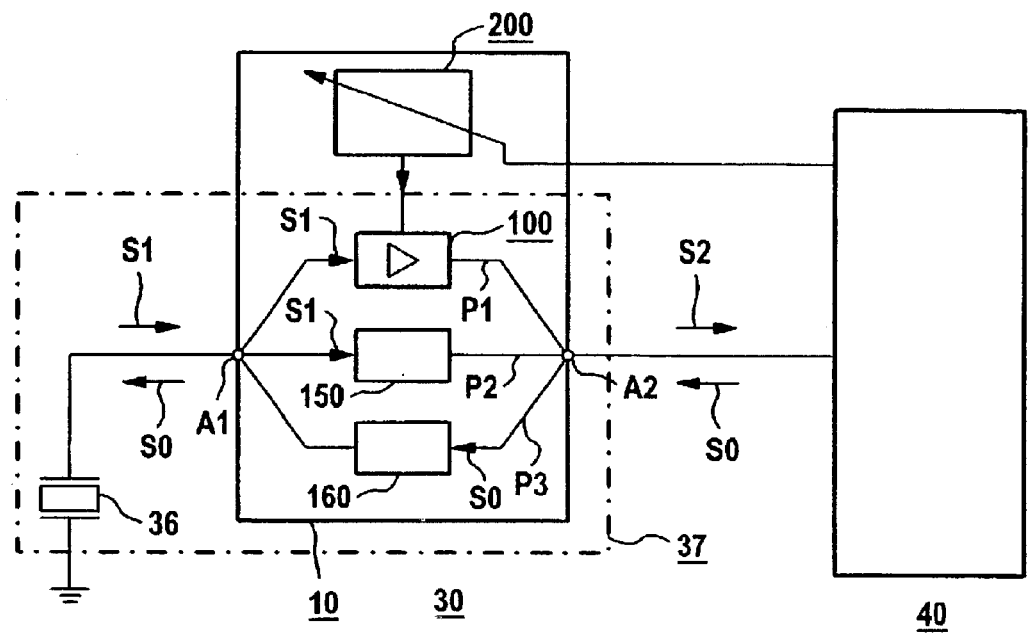
FIGS. 1 and 2 represent two exemplary embodiments of an ultrasound device having an amplifier arrangement.

An ultrasound device 30, having an amplifier arrangement 10, a sound transducer 36 and a transmitter/receiver unit 40, is represented in FIG. 1. The sound transducer 36 is connected to ground on one side and is electrically connected with a contact A1 of the amplifier arrangement 10. A second contact A2 of the amplifier arrangement 10 is electrically connected via a connecting line, not represented in detail, with the transmitter/receiver unit 40. The amplifier arrangement 10 is comprised of a total of three signal paths P1, P2 and P3, which are intended for signal transmission between the two contacts A1 and A2. In particular, the first and the second signal path P1, or P2, are intended for the receiving direction, and the third signal path P3 for the transmitting direction. The division into different signal paths for the transmitting and receiving directions is primarily advantageous because the signal amplitudes to be transmitted vary to a great degree from each other in both directions.

A transmitted signal S0 with a base frequency and a very high signal amplitude, for example of approximately 200 $V_{ss}$, is generated in the transmitter/receiver unit 40 and is supplied via the amplifier arrangement 10 to the sound transducer 36. The latter converts the transmitted signal S0 into a sound signal, which is radiated into a not represented medium to be examined. Within the framework of medical diagnostics, the medium to be examined can be a human body or, within the framework of non-destructive material testing, also a workpiece made of a solid material, for example a metallic body.

On its course through the medium to be examined, the sound signal is reflected at various locations. These echo signals are detected by the sound transducer 36 and are converted back into an electrical received signal S1, which is fed into the amplifier arrangement 10 at the contact A1 and, after passing through it, is supplied as the output signal S2 via the connecting line, not represented, of the transmitter/receiver unit 40, for further processing.

The signal amplitude of the received signal S1 essentially depends on the location in the medium to be examined at which the associated reflection has occurred. While an echo signal from a region near the surface of the medium to be examined results in a high signal amplitude, an echo signal from a region deep inside the medium to be examined results in an input signal S1 with a very low signal amplitude because of the path attenuation in the medium to be examined.

This system-related variation of the signal amplitude in the received signal S1 is compensated in the transmitter/receiver unit 40 in a so-called TGC module (time gain control), not represented.

However, the received signal S1 is initially pre-amplified in the amplifier arrangement 10 in the course of passing through a amplification element 100 arranged in the first signal path P1. The mode of operation of the amplification element 100 can be adapted to the described system-related variation of the signal amplitude in the received signal S1. To begin with, it is basically already known without an additional measurement of the received signal S1 on which order of magnitude the signal amplitude moves. Accordingly, for the relatively high signal amplitude of an echo signal close to the surface, it is possible to set a signal amplitude which is as distortion-free as possible, and for an echo signal from a region located deep in the examined region, the pre-amplification is optimized in respect to the greatest possible signal-noise ratio. These different operational states can be set with the aid of a controller 200. In particular, a D.C. voltage or D.C. current signal fed to the amplification element 100 is variably adapted. For this purpose, the controller 200 contain a controllable voltage or current source, for example, or also a combination of a constant voltage source or constant current source with an adjustable resistor element.

The mode of operation to which the amplification element 100 is actually set via the controller 200 is the result of a control routine being performed in the transmitter/receiver unit 40 which, inter alia, takes into account a synchronization in regard to the time of transmission of the transmitted signal S0. Therefore the controller 200 is either electrically connected with the transmitter/receiver unit 40, or is an integral part of it.

The amplifier arrangement 10 is partially integrated, together with the sound transducer 36, into a common transducer head 37. This is indicated in FIG. 1 by the frame drawn in dashed lines. Depending on the embodiment, the controller 200 can also be at least partially integrated into the transducer head 37.

The sound transducer 36 can be composed of several individual transducers, not represented in FIG. 1. Several amplifier arrangements 10 can also be correspondingly provided, each of which is assigned to an individual transducer. In the course of the integration into the transducer head 37, it is advantageous if, because of the close spatial conditions and of the limited possibility of heat removal, the amplifier arrangement 10 is constructed in a space-saving manner, i.e. from a few single elements, and has a reduced power leakage as well. The demand for a reduced power leakage is already met, at least to some extent, by the mentioned setting of the operating point being variably adapted to the respective signal amplitude of the received signal S1. On the average, a reduced power leakage is provided than with a constant operating point which would then be laid out in accordance with the maximally possible signal amplitude of the received signal S1.

However, the power leakage of the amplification element 100, which is dissipated, can also be further reduced. For this purpose, the amplification element 100 is completely deactivated, i.e. switched off, when a received signal S1 which has a high signal amplitude and therefore does not necessarily require pre-amplification, is present at the contact A1. This can be achieved in a simple manner through the controller 200. The D.C. voltage or D.C. current signals made available to the amplification element 100 are set back to zero. In order to still assure a dependable transmission of the received signal S1 from the contact A1 to the contact A2 in this operational state, the second signal path P2 is provided. The power leakage to be dissipated in the amplification element 100 may be considerably reduced, and therefore the integration capability of the amplifier arrangement 10 as a whole may be improved.

It is moreover possible to provide a second compensation element 150 in the second signal path P2, which is used for compensating the capacitive influence of the sound transducer 36 on the frequency response of the received signal S1.

A bypass element 160 is provided in the signal path P3, which for all practical purposes represents a short circuit for the transmitted signal S0 with its very high signal amplitude, and for all practical purposes an open circuit for the received signal S1 with its clearly lower signal amplitude.

Figure 2:
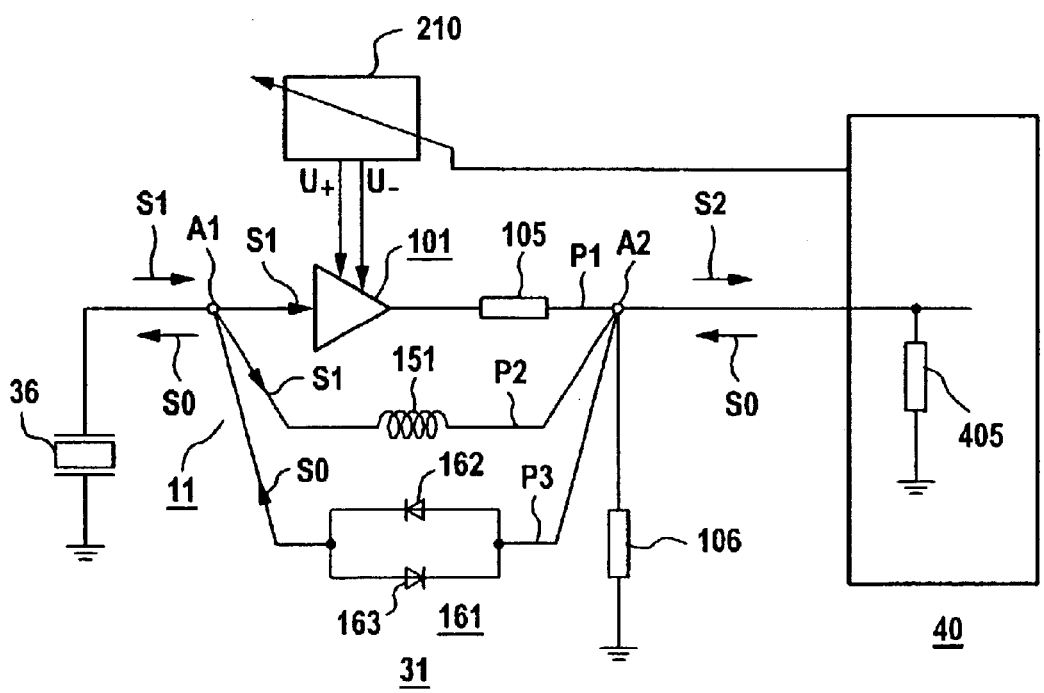

An ultrasound device 31 with an embodiment of an amplifier arrangement 11 is represented in FIG. 2. An amplification element 101 of the amplifier arrangement 11 is embodied as a monopolar or bipolar emitter follower. The amplifier arrangement 11 is provided with a diode pair 161 of two parallel-connected, oppositely oriented diodes 162 and 163 in the signal path P3 as the bypass element 160. Depending on the buckling strain of the diodes 162 and 163, the diode pair 161 then constitutes a short circuit for a signal with a high signal amplitude. But for a signal with a lower signal amplitude the diode pair 161 constitutes an open circuit. In the illustrated example, the threshold between the two operating modes approximately lies at 2 $V_{ss}$.

A negative and a positive supply voltage $U_-$ or $U_+$ are supplied to the amplification element 101, embodied as a bipolar emitter follower in the example, via a controllable voltage source 210. Its actual values are variably set in the transmitter/receiver unit 40, depending on the desired operational state of the amplification element 101.

Furthermore, a resistor 105 is optionally switched between the amplification element 101 and the contact A2 and is used for an improved adaptation of the output impedance to the wave impedance of the non-represented connecting line to the transmitter/receiver unit 40. Moreover, the contact A2 can be connected to ground in the form of a D.C. current path by means of a further optional resistor 106. However, the resistor 106 can also be omitted, in particular if a path to ground has been provided at another location in the ultrasound device 31, for example in the form of a ballast resistor 405 at the input of the transmitter/receiver unit 40. The ballast resistor 106 has a very high impedance (several Kohms), so that for all practical purposes it may not place a load on the output signal S2. Since it is located at the output of the amplifier arrangement 11, it practically does not degrade the noise factor.

The compensation element 150 provided in the second signal path P2 for compensating the frequency response of the sound transducer 36 is embodied as an inductive resistor 151 in the example in FIG. 2. A further advantage of the additional signal path P2 is disclosed here. In comparison with known amplifier arrangements in which a compensation inductive resistor at the contact A1 is usually switched parallel with the sound transducer 36, the inductive resistor 151 provided in the second signal path P2 of the amplifier arrangement 11 has the same effect in the receiving state when correspondingly dimensioned and additionally may improve the integration capability.

A compensation inductive resistor arranged parallel in relation to the contact A1, as in the prior art, is designed to have a substantially large volume in order to prevent saturation by the transmitted signal S0 and the distortion occurring along with that. The large structural volume reduces the integration capability. Since in contrast to this, only the received signal S1, but not the transmitted signal S0, passes through the signal path P2, it is possible to design the inductive resistor 151 with a clearly reduced structural volume, since the danger of saturation can be ruled out. A signal with a high signal amplitude is transmitted in the third signal path P3. The maximal signal level at the inductive resistor 151 is determined by the buckling strain of the diodes 162 and 163. As already mentioned in the exemplary embodiment, it lies at approximately 2 $V_{ss}$.

Furthermore, because of the special arrangement of the inductive resistor 151 in the second signal path P2, a size of the inductance value results which, compared with wiring of the contact A1 with a comparable compensation inductive resistor, is lower by the factor (1−V). Here, V identifies the voltage amplification of the amplifier arrangement 11 between the contact A1 and the contact A2. This is calculated from the voltage amplification of the amplification element 101 embodied as an emitter follower and, to the extent it exists, from the voltage divider formed by the resistor 105 and the small signal load impedance acting on the contact A2. In the example, the entire voltage amplification of the amplifier arrangement 11 is less than 1. Usually the value will lie approximately between 0.5 and 0.9. Because of the particularly advantageous circuitry arrangement of the inductive resistor 151, the inductance value therefore is about 0.1 to 0.5 times the value which would have to be provided for a parallel switched inductive resistor at the contact A1.

In this way, the circuitry design step of additionally providing the second signal path P2 results in advantages in respect to integration capability. This is important in particular because such a compensation inductive resistor should be provided, if possible, for every individual transducer of the sound transducer 36.

In place of an inductive resistor 151, it is also possible to provide a more elaborate impedance as the compensation element 150, for example a parallel arrangement of an inductive resistor and a capacitive resistor. In this case the design is primarily based on the requirements made on the compensation of the sound transducer 36. The mentioned advantages apply in the same way also to the more elaborate impedance.

Figure 3:
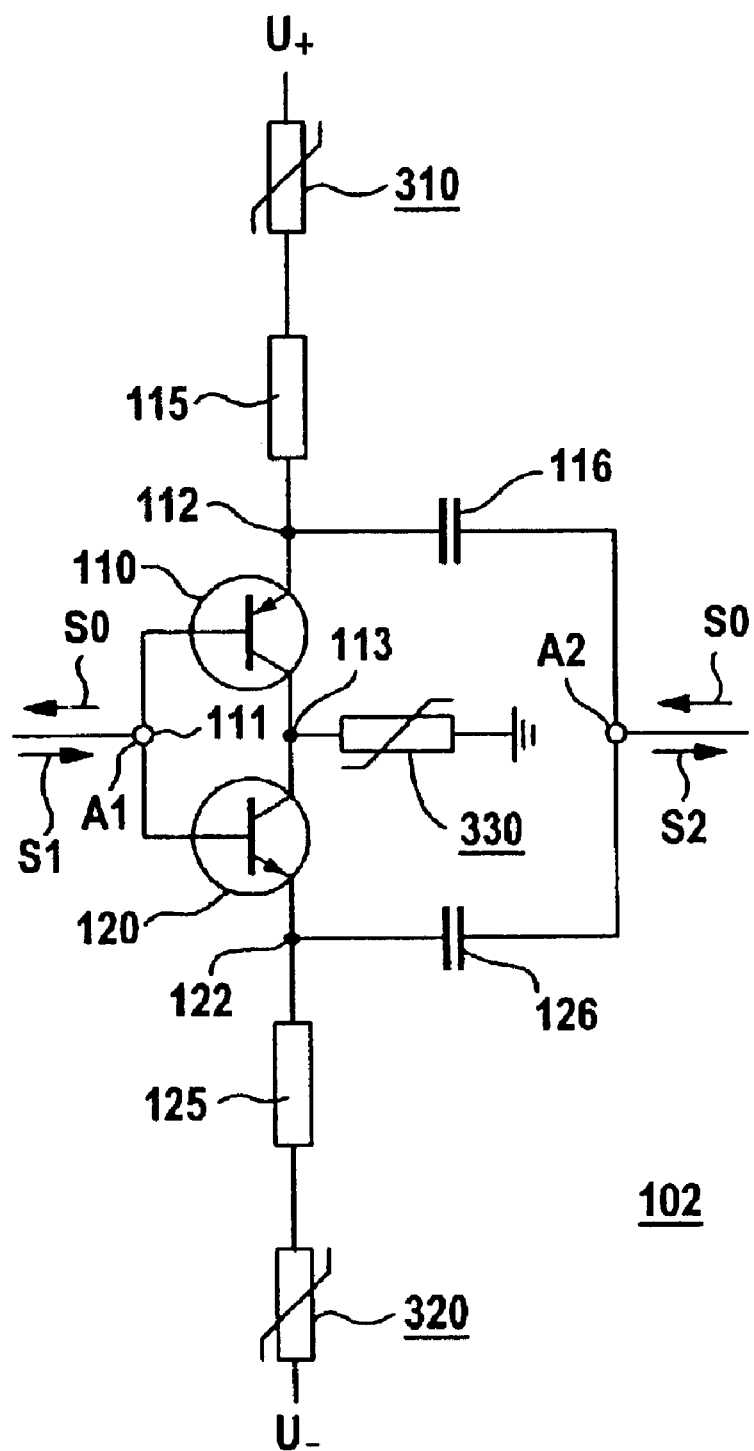
FIG. 3 shows one embodiment of an amplification element installed in the amplifier arrangement in FIGS. 1 and 2.

An exemplary embodiment of an amplification element 100 or 101 is represented in FIG. 3, which is embodied as a push-pull amplifier in the form of a complementary bipolar emitter follower 102. It contains two semiconductor components, a pnp transistor 110 and an npn transistor 120. The pnp transistor 110 and the npn transistor 120 have a common base contact 111, as well as a common collector contact 113, which is connected to ground potential via a bipolar current limiter 330. An emitter contact 112 of the pnp transistor 110 and an emitter contact 122 of the npn transistor 120 are respectively connected by means of a coupling capacitive resistor 116 or 126 with the contact A2. At the base frequency, the coupling capacitive resistors 116 or 126 represent an electrical short circuit for all practical purposes.

The received signal S1 is fed into the emitter follower 102 via the common base contact 111, which corresponds to the first contact A1. The output signal S2 is present at the second contact A2. The two emitter contacts 112 and 122 are connected, each via a negative feedback resistor 115, or 125, as well as further bipolar current limiters 310, or 320, to the positive, or negative, supply voltage $U_+$, or $U_-$, of the not-represented controllable voltage source 210.

A static collector current of the two transistors 110 and 120 is set by the two supply voltages $U_+$ and $U_-$. The static collector current essentially determines the actual operating point of the two transistors 110 and 120. A variation of the supply voltages $U_+$ and $U_-$. changes the static collector current, and therefore the setting of the operating point. By means of a reduction of the supply voltages $U_+$ and $U_-$, it is possible in particular to switch off the emitter follower 102.

In the emitter follower 102 represented in FIG. 3, the two negative feedback resistors 115 and 125 typically have a value of 1 kohms, and the two coupling capacitive resistors 116 and 126 typically have a value of 20 nF. The two coupling capacitive resistors 116 and 126 are dimensioned in such a way that their reactance at the lowest relevant signal frequency of the received signal S1 is small in comparison with a load impedance, not represented. For example, a BFT 92 of the firm Infineon is provided as the pnp transistor 110, and a BFR 92, also of the firm Infineon, is for example provided as the npn transistor 120.

To assure a signal transmission in the transmitting direction, along with an unlimited amplification function in the receiving direction at the same time, the emitter follower 102 contains the three passive bipolar current limiters 310, 320 and 330. At a high signal amplitude, these limit the current, depending on its polarity, to a positive or a negative limit current. At a low signal amplitude, however, the current limiters 310, 320 and 330 each act in the manner of an ohmic resistor. The structure and function of the bipolar current limiters 310, 320 and 330 is extensively described in FIG. 9, as well as the associated portion of the text, of DE 199 16 902 A1 (U.S. application Ser. No. 09/958,717, the disclosure of which is incorporated herein by reference). This is essentially a combination of two self-conducting MOSFETs and an ohmic resistor. Since no particular connection to an electrical supply voltage is required, the current limiters 310, 320 and 330 are here also called passive.

At the low signal amplitude present in the receiving direction, the current limiters 310, 320 and 330 de facto act in the manner of additionally provided ohmic resistors. In the case of the two current limiters 310 and 320, therefore, only the resistance value is increased, which is active for the negative feedback and is otherwise determined by the resistors 115, or 125. But this does not change the basic behavior. But with the high signal amplitude present in the transmitting direction, based on their current limiting behavior, the current limiters 310, 320 and 330 cause only the loss of a relatively small energy portion of the transmitted signal S0.

An alternative embodiment to the emitter followers 102 exists, which substantially has the same effect, but makes do with only two bipolar current limiters. This is explained in greater detail in FIG. 8, as well as the associated portion of the text, of DE 199 16 902 A1.

The third signal path P3 separately provided in the amplifier arrangements 10 and 11 in FIG. 1 or 2 is primarily used for relieving the base emitter diode paths of the two transistors 110 and 120. The signal path P3, possibly also in combination with the optional resistor 105, also contributes to the prevention of damage to the transistors 110 and 120 by a very high signal amplitude of the transmitted signal S0. For reasons of a simpler representation, the optional resistor 105 has not been drawn in FIG. 3. It would also be basically possible to omit the separate signal path P3 provided for transmitting the transmitted signal S0, if the amplification elements 100, or 101 are embodied in the form of the emitter follower 102, and the dimensions of the resistor 105 are small, or it is completely omitted.

The emitter follower 102 is also capable of transmitting the transmitted signal S0 from the contact A2 to the contact A1. This takes place via the base emitter diode path of the two transistors 110 and 120. Thus, the emitter follower 102 permits the signal transmission in the transmitting direction, as well as in the receiving direction, and the functions of the first and the third signal path P1, or P3, are combined in this way.

Figure 4:
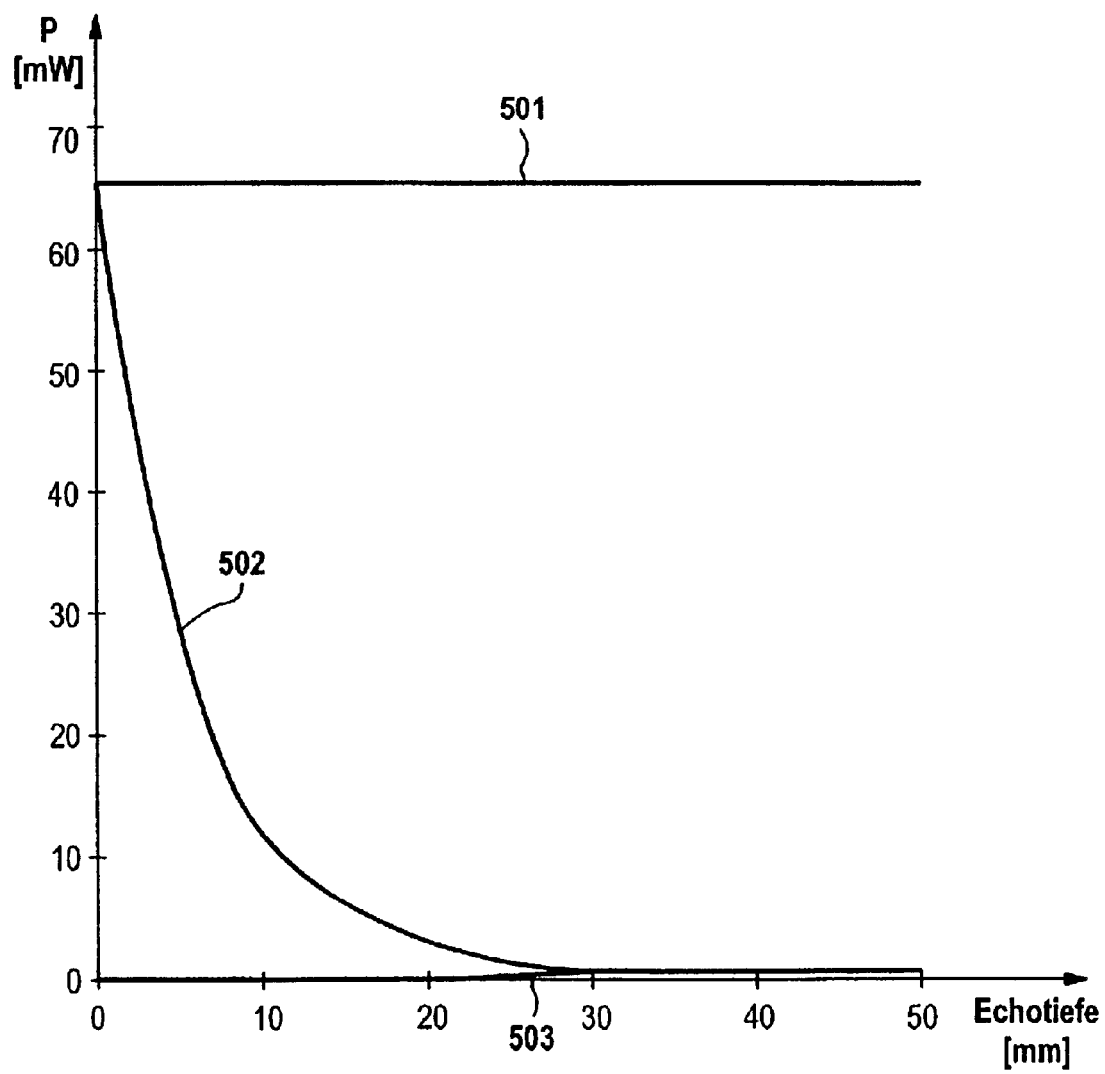
FIG. 4 represents a comparison of the power consumption of various amplifier arrangements.

A diagram of the power consumption of various amplifier arrangements is represented in FIG. 4. In the diagram the power consumption is indicated in mW over the echo depth in mm inside the examined object. The echo depth is directly correlated with the acoustical running time inside the examined object. Both values can be converted into each other. The measurement graphs represented in the drawing relate to a base frequency of 9 MHz and a tissue damping of 0.5 dB/(cm·MHz).

The measurement graph 501 shows the power consumption of an amplifier arrangement not containing any controller 200 for the variable adjustment of the mode of operation of the amplification element 100. Therefore, the operating point of such an amplifier arrangement should be set to be constant as a function of the highest signal amplitude in the received signal S1. A constant power consumption of approximately 65.5 mW was detected.

The measurement graph 502 shows the power consumption wherein the mode of operation of the amplifier arrangement has been updated in accordance with the expected maximum signal amplitude of the received signal S1. Accordingly, because of the then prevalent high signal amplitude from echo signals close to the surface, the power consumption also starts at 65.5 mW, but then drops in connection with later echo signals from the depth of the examined object to a value of approximately 0.72 mW. An average value of approximately 9.3 mW is the result.

The measurement graph 503 was determined for one of the amplifier arrangements 10 or 11, in which the amplification element 100, or 101, is completely deactivated during the echo signals from close to the surface. Only with echo signals from the depth of the examined object, the amplification element 100, or 101, is slowly switched from the switched-off mode of operation into a mode of operation suitable for a low signal amplitude of the received signal S1, so that here too, the power consumption reaches the end value of approximately 0.72 mW. Approximately 0.36 mW result as a chronological median value.

The reduction in the power consumption achieved by means of the additional second signal path P2, and therefore of the required heat removal, becomes obvious from the comparative summary in FIG. 4. With this, as well as with the advantageous dimensioning of the compensation elements 150, the amplifier arrangements 10 and 11 show an improved integration capability in comparison with the prior art. Moreover, a further advantage resides in that the amplifier arrangements 10 and 11 themselves remain functioning in the passive mode of operation even in case of a loss of the supply voltages $U_+$ and $U_-$, or of the amplification elements 100 or 101. At any rate, this option does not exist in the known amplifier arrangements.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

What is claimed is:

1. An amplifier arrangement for amplifying a signal, the arrangement comprising:
    a) an active amplification element arranged between a first and a second contact within a first signal path which amplifies a signal fed in at the first contact; and
    b) a controller for a variable operations of the amplification element; further characterized by:
    c) a passive second signal path which is arranged parallel with the first signal path and bypasses the first signal path; and
    d) a third signal path which is connected parallel with the first and second signal paths, wherein the third signal path is laid out for a second signal direction which extends opposite to a first signal direction for which the first and second signal paths are laid out.

2. The amplifier arrangement in accordance with claim 1, wherein the amplifier arrangement comprises a transmitter/receiver amplifier arrangement.

3. The amplifier arrangement in accordance with claim 1 wherein the first and second signal paths are respectively laid out for a first signal direction.

4. The amplifier arrangement in accordance with claim 1 wherein the third signal path includes a bypass element.

5. The amplifier arrangement in accordance with claim 1 wherein the third signal path comprises a diode pair.

6. The amplifier arrangement in accordance with claim 1 wherein the second signal path comprises a passive compensation element.

7. The amplifier arrangement in accordance with claim 1 wherein the second signal path comprises a reactive impedance device.

8. The amplifier arrangement in accordance with claim 1 wherein the second signal path comprises an inductive resistor.

9. The amplifier arrangement in accordance with claim 1 wherein the controller comprises at least one of a controllable voltage, current source, or combinations thereof.

10. The amplifier arrangement in accordance with claim 1 wherein the controller is operable to switch the amplification element on and off.

11. The amplifier arrangement in accordance with claim 1 wherein the amplification element comprises an emitter follower.

12. The amplifier arrangement in accordance with claim 1 further comprising two signal nodes common to all of the first, second and third signals paths.

13. An ultrasound receiver amplification device comprising:
    a sound transducer;
    an active amplification element arranged between a first and a second contact within a first signal path, the amplification element operable to amplify a signal fed in at the first contact;
    a controller operable to variably operate the amplification element;
    a passive second signal path arranged parallel with the first signal path;
    a third signal path which is connected parallel with the first and second signal paths, wherein the third signal path is laid out for a second signal direction which extends opposite to a first signal direction for which the first and second signal paths are laid out; and
    wherein the sound transducer is connected with one of the first and second contacts of the amplifier arrangement.

14. The ultrasound device in accordance with claim 13 wherein the amplifier arrangement comprises a pre-amplifier.

15. The ultrasound device in accordance with claim 13 wherein the sound transducer and at least a portion of the amplifier arrangement comprise an integrated common unit.

16. The ultrasound device in accordance with claim 13 further comprising two signal nodes common to all of the first, second and third signals paths.

17. An amplifier arrangement for amplifying a signal, the arrangement comprising:
    a) an active amplification element arranged between a first and a second contact within a first signal path which amplifies a signal fed in at the first contact; and
    b) a controller for a variable operations of the amplification element; further characterized by:
    c) a passive second signal path which is arranged parallel with the first signal path and bypasses the first signal path; and
    d) a third signal path which is connected parallel with the first and second signal paths, wherein the third signal path comprises a diode pair.

* * * * *